US006465362B1

(12) United States Patent
Chae et al.

(10) Patent No.: US 6,465,362 B1
(45) Date of Patent: Oct. 15, 2002

(54) METHOD FOR FORMING GATE OF SEMICONDUCTOR DEVICE

(75) Inventors: Soo Doo Chae, Seoul; Kyoung Jin Yoo, Daejon, both of (KR)

(73) Assignee: Hyundai Electronics Industries, Co., Ltd., Kyoungki-Do (KR)

( * ) Notice: Subject to any disclaimer, the term of this patent is extended or adjusted under 35 U.S.C. 154(b) by 32 days.

(21) Appl. No.: 09/634,859

(22) Filed: Aug. 8, 2000

(30) Foreign Application Priority Data

Sep. 3, 1999 (KR) ............................................ 99-37376

(51) Int. Cl.[7] ............................................ H01L 21/302
(52) U.S. Cl. ........................................ 438/714; 438/709
(58) Field of Search ................................ 438/709–714, 438/721, 737, 749, 755, 592

(56) References Cited

U.S. PATENT DOCUMENTS 5,897,349 A * 4/1999 Agnello ...................... 438/230
5,914,276 A * 6/1999 Shin et al. .................. 438/714
6,124,212 A * 9/2000 Fan et al. .................... 438/709

* cited by examiner

*Primary Examiner*—David Nelms
*Assistant Examiner*—Dung A Le
(74) *Attorney, Agent, or Firm*—Fleshner & Kim, LLP

(57) ABSTRACT

The present invention relates to a method for forming a gate of a semiconductor device that uses a cobalt silicide. The method for forming the gate of the semiconductor device can include preparing a semiconductor substrate, form a first insulation layer on the semiconductor substrate, form a doped polycrystalline silicon layer simultaneously with a deposition or after the deposition and forming a cobalt silicide layer by another deposition or by reacting a cobalt layer with the polycrystalline silicon layer. The cobalt silicide layer is selectively removed by using at least one etchant gas selected from a group of a gas including a chlorine atom group, a gas mixture of the gas including the chlorine atom group and oxygen, a gas mixture of the gas including the chlorine atom group and an inert gas, and a gas including the above-enumerated gases and a gas having a fluorine atom group. Then, the polycrystalline silicon layer is patterned. The method for forming the gate of the semiconductor device uses a less complex, less costly or more efficient process, and reduces a resistance of the gate.

21 Claims, 2 Drawing Sheets

METHOD FOR FORMING GATE OF SEMICONDUCTOR DEVICE

BACKGROUND OF THE INVENTION

1. Field of the Invention

The present invention relates to a method for fabricating a semiconductor device, and in particular to a method for forming a gate of a semiconductor device.

2. Background of the Related Art

As an integration technology of a semiconductor device is developed, a design rule thereof has become gradually stricter. In highly integrated devices with strict design rules, a delay of an operational speed of the device resulting from a high resistance of a gate becomes a serious problem. In order to solve such a problem, a polycide (i.e., silicide on doped polycrystalline silicon) gate electrode formed of a refractory metal silicide having a low resistance on a doped polycrystalline silicon has been generally used as a gate electrode. Currently, a popular material for the polycide is a tungsten silicide such as $WSi_2$, which has a specific resistance of 60~200 $\mu\Omega$cm. Since an integration degree of the device has been increased, there is an increasing demand for a silicide having a lower resistance than the tungsten silicide. In regard to this, a cobalt silicide such as $CoSi_2$, which has a specific resistance of 15~20 $\mu\Omega$cm and a titanium silicide such as $TiSi_2$, which has a specific resistance of 15~20 $\mu\Omega$cm have been noted.

Both the cobalt silicide and the titanium silicide have a low specific resistance property between 15 and 20 $\mu\Omega$cm, and thus could replace the tungsten silicide. The cobalt silicide is superior to the titanium silicide in many respects. Superior properties of the cobalt silicide will now be described.

First, during an annealing step after forming the silicide, the silicide is agglomerated, and thus, a resistance thereof is increased. The agglomeration phenomenon occurs less in the cobalt silicide than in the titanium silicide. As a result, the cobalt silicide has better thermal stability than the titanium silicide.

Second, in the titanium silicide, as a width of a gate is decreased, a resistance thereof is significantly or remarkably increased. However, even when a width of a gate is narrow, a resistance of the cobalt silicide is maintained low.

Third, the cobalt silicide can dope the polycrystalline silicon by using a Silicide-As-Doping source (SADS) method. The SADS method is a doping method of the polycrystalline silicon that implants and anneals a dopant into the silicide, and diffuses the implanted dopant into the polycrystalline silicon therebelow. Here, the titanium silicide has a great reactivity with a dopant such as arsenic (As), phosphorous (P) and boron (B). Accordingly, the titanium silicide cannot be used in accordance with the SADS method. Conversely, the cobalt silicide has a small reactivity with the dopant, and thus, the SADS method can be employed.

Although having many advantages, the cobalt silicide is hard to adapt to the polycide. In the case of the titanium silicide, a volatile material such as TiF and $TiCl_2$ is generated according to a dry etching process, and thus, it is possible to perform an etching process for forming the polycide. However, cobalt (Co) composing the cobalt silicide is chemically stable, and thus, a corresponding volatile material such as TiF and $TiCl_2$ is rarely generated, differently from titanium (Ti). As a result, the cobalt silicide has a disadvantage in that it is difficult to carry out the etching process for forming the polycide.

In order to overcome the above-mentioned disadvantage for cobalt silicide, there has been employed a Damascent method of forming an insulation layer. The Damascent method operates by forming a hole by partially etching the insulation layer of an area where the cobalt silicide layer will be formed, forming the cobalt silicide layer in the hole, and removing the insulation layer. However, the Damascent method has complicated processes, and is difficult to perform a critical dimension (CD) control for forming the cobalt silicide layer to have a pattern of a desired size for highly integrated devices. Accordingly, the Damascent method cannot be practically used. As a result, a method of etching the cobalt silicide is needed to form the polycide using or consisting of the cobalt silicide.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide a method for fabricating a gate of a semiconductor device that substantially obviates one or more problems caused by disadvantages and limitations of the related art.

Another object of the present invention to provide a method for fabricating a polycide gate.

Another object of the present invention to provide a method for fabricating a polycide by using a cobalt silicide such as $CoSi_2$ which has various excellent properties.

In order to achieve at least the above-described objects in a whole or in parts of the present invention, there is provided a method for forming a gate of a semiconductor device, that includes a step of preparing a semiconductor substrate, a step of forming a first insulation layer on the semiconductor substrate, a step of forming a polycrystalline silicon layer doped simultaneously with deposition or after the deposition, a step of forming a cobalt silicide layer by deposition or by reacting a cobalt layer with the polycrystalline silicon layer, a step of patterning the cobalt silicide layer by using at least one etchant gas selected from a group of a gas including a chlorine atom group, a gas mixture of the gas including the chlorine atom group and oxygen, a gas mixture of the gas including the chlorine atom group and an inert gas, and a gas including the above-described gases and a gas having a fluorine atom group and a step of patterning the polycrystaline silicon layer.

To further achieve the above objects in a whole or in parts, there is provided a method of manufacturing a semiconductor device according to the present intention that includes providing a semiconductor substrate, forming a first insulation layer, a polycrystaline silicon layer and a cobalt silicide layer on the semiconductor substrate, patterning the cobalt silicide layer by using at least one etchant gas selected from the group consisting of a first gas including a chlorine atom group, a second gas being a mixture of the first gas and oxygen, a third gas being a mixture of the first gas and an inert gas, and a fourth gas being one of the first through third gases and a gas having a fluorine atom group, and patterning the polycrystalline silicon layer.

To further achieve the above objects in a whole or in parts, there is provided a method of manufacturing a semiconductor device according to the present intention that includes providing a semiconductor substrate, sequentially forming a first insulation layer, a polycrystalline silicon layer and a cobalt silicide layer on the semiconductor substrate, patterning the cobalt silicide layer by using at least one etchant gas including a chlorine atom group, and patterning the polycrystalline silicon layer to form a gate electrode.

Additional advantages, objects, and features of the invention will be set forth in part in the description which follows and in part will become apparent to those having ordinary skill in the art upon examination of the following or may be learned from practice of the invention.

The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

A method for forming a gate of a semiconductor device in accordance with a preferred embodiment of the present invention will now be described with reference to FIGS. 1 through 4. A channel stop region (not shown) is formed by doping an impurity at a prescribed region of a semiconductor substrate 1, which is preferably called an isolation region and an active region in accordance with a device isolation method such as a localized oxidation isolation (LOCOS) method or a shallow trench method. In general, a single crystalline silicon is used as the semiconductor substrate 1. In addition, a silicon on insulator (SOI) structure or the like where a silicon film is formed on an insulation substrate, such as a sapphire and a silicon oxide, can be employed as the semiconductor substrate 1.

Figure 1:
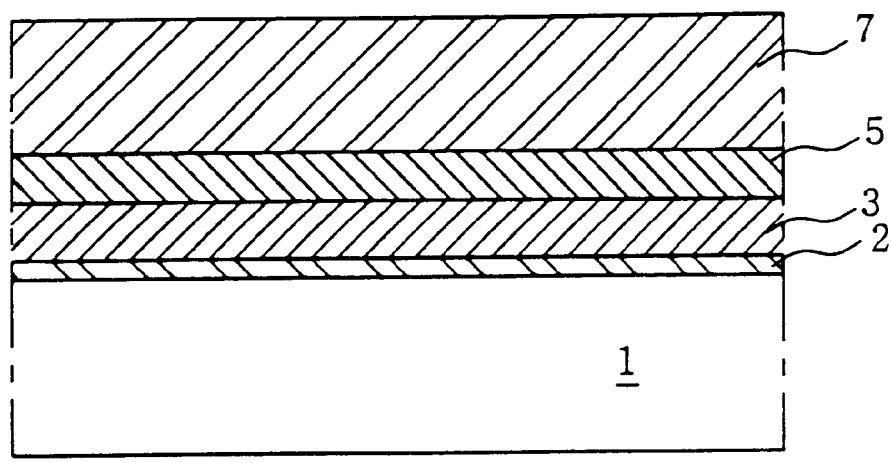
FIGS. 1 through 4 are diagrams that show cross-sectional views illustrating a method for forming a gate of a semiconductor device in accordance with a preferred embodiment of the present invention.

As illustrated in FIG. 1, a first insulation layer 2 forming a gate insulation layer, a polycrystalline silicon layer 3, a cobalt silicide layer 5 such as $CoSi_2$, and a second insulation layer 7 preferably consisting of an oxide or nitride are sequentially formed on the semiconductor substrate 1. A diffusion barrier layer may be formed between the polycrystalline silicon layer 3 and the cobalt silicide layer 5. A tungsten (W) or a tungsten nitride (WNx), which can prevent diffusion between the polycrystalline silicon layer 3 and the cobalt silicide layer 5, is preferably utilized as a material of the diffusion barrier layer. However, the present invention is not intended to be so limited.

The gate insulation layer 2 is preferably formed by thermally oxidizing the surface of the semiconductor substrate 1 or by depositing an insulation layer consisting of a silicon dioxide and a silicon oxynitride according to a chemical vapor deposition (CVD) method. In addition, the gate insulation layer 2 may be formed by combining the thermal oxidation process and the CVD method. The polycrystalline silicon layer 3 is doped after deposition or simultaneously with the deposition. The cobalt silicide layer 5 may be formed by deposition, or by depositing, annealing and reacting a cobalt layer with the polycrystalline silicon layer 3.

Figure 2:
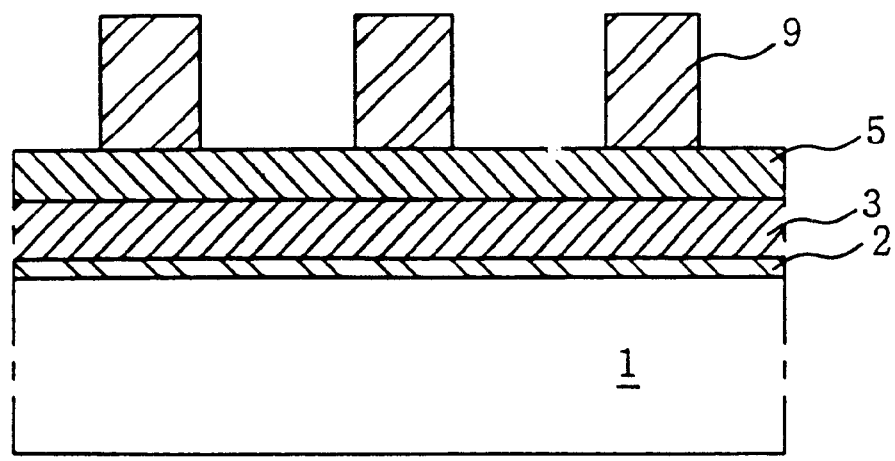

As depicted in FIG. 2, a hard mask 9 preferably consisting of an oxide or nitride is formed by patterning the second insulation layer 7 according to a photoetching process using a photoresist film (not shown) as a mask. In patterning the second insulation film 7, various etching processes can be utilized. Especially, a dry etching process using an etchant gas, such as Ar, $CF_4$ and $CHF_3$ is popularly used.

Figure 3:
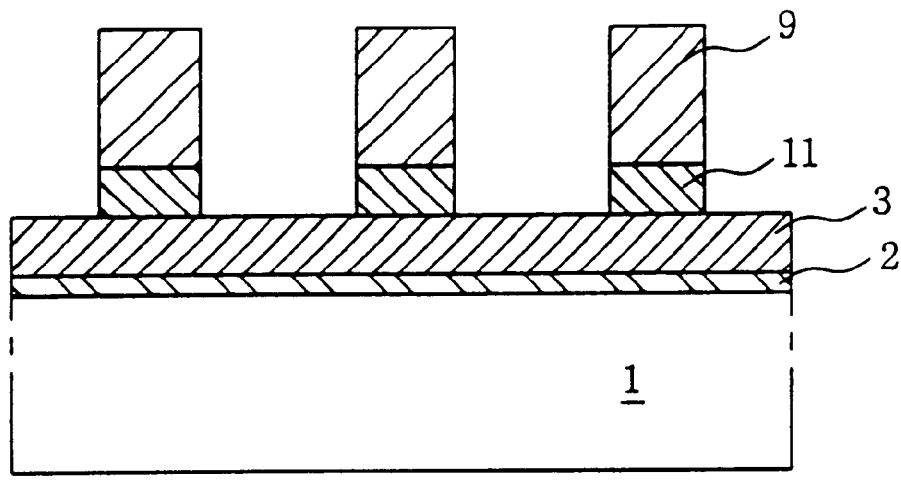

As shown in FIG. 3, a cobalt silicide pattern 11 is formed by patterning the cobalt silicide layer 5 in accordance with the photoetching process using the hard mask 9 as a mask. The cobalt silicide layer 5 may be patterned by employing a photoresist film pattern (not shown), instead of the hard mask. In this case, in the process as shown in FIG. 1, spreading and patterning the photoresist film are sequentially performed, instead of forming the second insulation layer 7.

The cobalt silicide layer 5 may be patterned according to various etching processes. Especially, the cobalt silicide layer 5 is patterned in accordance with an anisotropic etching process using a dry etching device, such as a reactive ion etcher (RIE), a magnetically enhanced reactive ion etcher (MERIE) and a high density plasma etcher (HDP). The above-described dry etching devices can dependently or independently control an ion density and an ion energy of a plasma generated in a vacuum chamber. Operational conditions of a dry etching device in accordance with the preferred embodiment will now be described by exemplifying a helicon type etcher among the high density plasma etchers HDP. Exemplary operational conditions are provided in Table 1.

TABLE 1

| Source Power | Bias Power | Chamber Pressure | Chamber Temperature |
| --- | --- | --- | --- |
| 100~2500 W | 20~300 W | Below 20 mT | −10~300° C. |

At least one gas selected from a group of a gas including a chlorine atom group, a gas mixture of the gas including the chlorine atom group and oxygen, a gas mixture of the gas including the chlorine atom group and an inert gas, and a gas including the above-described gases and a gas having a fluorine atom group is preferably used as an etchant gas for etching the cobalt silicide 5 by using the dry etching devices according to the preferred embodiment of the method for forming a gate. For example, the etchant gases can be $BCl_3$, $Cl_2$, a gas mixture of $BCl_3$ and $Cl_2$, a gas mixture of $BCl_3$ and $O_2$, a gas mixture of $Cl_2$ and $O_2$, a gas mixture of $Cl_2$ and Ar, a gas mixture of $BCl_3$ and Ar, a gas mixture of $SF_6$ and $BCl_3$, a gas mixture of $BCl_3$, $O_2$ and Ar, a gas mixture of $SF_6$, $BCl_3$ and $O_2$, a gas mixture of BCl, $O_2$, Ar and $Cl_2$, and a mixture of $BCl_3$, $O_2$, Cl and $SF_6$. Other etchant gases satisfying the above-described conditions can also be used according to the preferred embodiment. An etchant gas that includes the oxygen or inert gas has an advantage in that an amount of foreign materials generated during the etching process is decreased.

When a plasma is generated in the vacuum chamber of the dry etching device filled with the above-described etchant gases, reactive chlorine ions are generated in the plasma. The reactive chlorine ions react with the cobalt Co in the cobalt silicide, thereby forming a volatile compound. As a result, the cobalt silicide layer 5 can be efficiently etched. In this process, an etching temperature is preferably maintained between −10 and 300° C., which prevents or reduces the foreign materials from being generated at sidewalls of the cobalt silicide pattern 11 during the etching process. Accordingly, the sidewalls of the cobalt silicide pattern 11 have a vertical or improved profile. If a diffusion barrier layer is formed between the polycrystalline silicon layer 3 and the cobalt silicide layer 5, when the cobalt silicide layer 5 is etched and patterned, the diffusion barrier layer is also etched and patterned.

Figure 4:
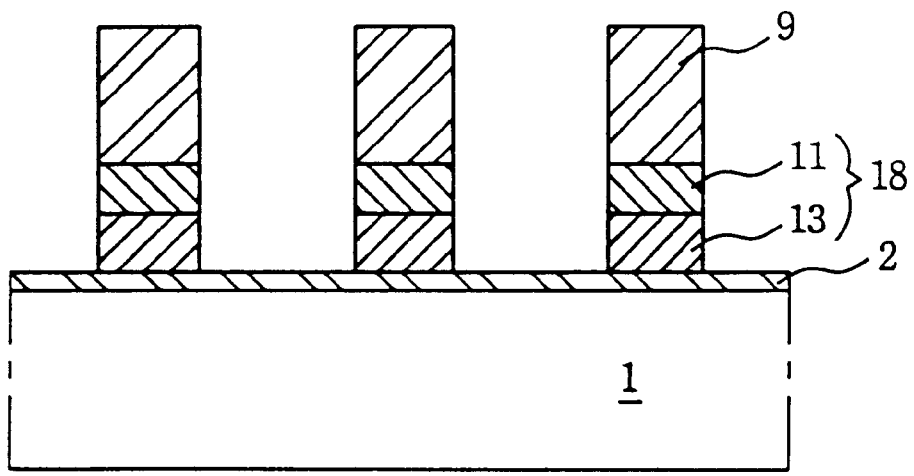

As depicted in FIG. 4, the polycrystalline silicon layer 3 is patterned in accordance with the photoetching process using the hard mask 9 and the cobalt silicide pattern 11 as a mask to form a polycrystalline silicon pattern 13. The polycrystalline silicon pattern preferably composes a polycide gate electrode 18 with the cobalt silicide pattern 11.

The polycrystalline silicon layer 3 may be patterned in various methods. In particular, an anisotropic etching using the dry etching device, such as the reactive ion etcher (RIE), the magnetically enhanced reactive ion etcher (MERIE) and the high density plasma etcher (HDP) can be used. At least one gas is preferably selected from a group including a gas including a chlorine atom group and a gas including HBr. For example, etchant gases are $Cl_2$, HBr, a gas mixture of $Cl_2$ and HBr, a gas mixture of $Cl_2$ and $O_2$, a gas mixture of $Cl_2$ and $N_2$, a gas mixture of HBr and $O_2$, a gas mixture of HBr and $N_2$, a gas mixture of $Cl_2$, HBr and $N_2$ and a gas mixture of $Cl_2$, HBr and $O_2$. In addition, other etchant gases that have been used for etching the silicon can be employed.

After the polycide gate electrode 18 is formed, the hard mask 9 formed on the cobalt silicide pattern 11 is operated as a capping insulation layer. Thus, an additional process or step of forming the capping insulation layer is not necessary.

When the step of forming the polycide gate electrode 18 is finished, a source/drain (not shown), an interconnection structure (not shown) and a capacitor (not shown) are formed by a method known to one of ordinary skill in the art, and thus fabrication of the semiconductor device is finished. The polycide gate electrode in accordance with the preferred embodiment of the present invention can be adapted to a semiconductor device including a gate, such as an n-type Metal Oxide Semiconductor (NMOS) transistor, a p-type Metal Oxide Semiconductor (PMOS) transistor and a Complementary Metal Oxide Semiconductor (CMOS) transistor. Thus, the preferred embodiment of the gate can be applied to various kinds of semiconductor integration circuits.

As described above, the preferred embodiment of a method for forming a gate in a semiconductor device according to the present invention has various advantages. In accordance with a preferred method for forming a polycide gate, the cobalt silicide is directly etched and patterned. Thus, the preferred embodiment of a process for forming the gate electrode is simplified, as compared with the related art Damascent method. In addition, the preferred embodiment can perform critical dimension (CD) control in order to form the cobalt silicide layer having a pattern of a desired or preferable size. Further, according to the preferred embodiment, a hard mask of an oxide or nitride is operated as a mask for patterning the polycide gate electrode, and as a capping insulation layer for insulating the polycide gate electrode from the bit line. As a result, it is not necessary to form a specific capping insulation layer, which further simplifies the process. In addition, in accordance with the preferred embodiment, the cobalt silicide is used as a polycide to reduce a resistance of the gate electrode. It is also possible to use the cobalt silicide as the silicide as a dopant source SADS.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for forming a gate of a semiconductor device, comprising:

providing a semiconductor substrate;

forming a first insulation layer, a polycrystalline silicon layer and a cobalt silicide layer on the semiconductor substrate;

forming a second insulation layer consisting of one of an oxide and a nitride on the cobalt silicide layer;

patterning the second insulation layer patterning the cobalt silicide layer by using the patterned second insulation layer as a mask and etching the cobalt silicide layer with at least one etchant gas selected from the group consisting of a first gas including a chlorine atom group, a second gas being a mixture of the first gas and oxygen, a third gas being a mixture of the first gas and an inert gas, and a fourth gas being one of the first through third gases and a gas having a fluorine atom group; and patterning the polycrystalline silicon layer, wherein the second insulation layer is not removed and serves as a capping insulation layer for insulating the cobalt silicide layer.

2. The method according to claim 1, wherein the patterned second insulation layer is used as a hard mask for forming the gate of the semiconductor device to mask the polycrystalline silicon layer and the cobalt silicide for patterning.

3. The method according to claim 2, wherein the second insulation layer is patterned by using at least one gas selected from the group consisting of Ar, $CF_4$ and $CHF_3$.

4. The method according to claim 1, further comprising:

forming a tungsten diffusion barrier layer between the polycrystalline silicon layer and the cobalt silicide layer; and patterning the diffusion barrier layer.

5. The method according to claim 1, further comprising:

forming a tungsten nitride diffusion barrier layer between the polycrystalline silicon layer and the cobalt silicide layer; and patterning the diffusion barrier layer.

6. The method according to claim 1, further comprising one of doping the polycrystalline silicon layer after forming the polycrystalline silicon layer, and doping the polycrystalline silicon layer substantially concurrently with the forming the polycrystalline silicon layer.

7. The method according to claim 1, wherein the cobalt silicide layer is one of formed by deposition, and formed by depositing, annealing and reacting a cobalt layer with the polycrystalline silicon layer.

8. The method according to claim 1, wherein the cobalt silicide layer is patterned by a dry etching device that can dependently or independently control an ion density and an ion energy of a plasma generated in a vacuum chamber.

9. The method according to claim 8, wherein the dry etching device is one of plasma etcher devices including a reactive ion etcher (RIE), a magnetically enhanced reactive ion etcher (MERIE) and a high density plasma etcher (HDP), and wherein the polycrystalline silicon layer is patterned by the dry etching device.

10. The method according to claim 9, wherein a source power is between 100 and 2500 W, a bias power is between 20 and 300 W and a chamber pressure is below 20 mT according to operational conditions of the plasma etcher device.

11. The method according to claim 1, wherein the cobalt silicide layer is patterned at a temperature between −10 and 300° C.

12. The method according to claim 1, wherein an etchant gas used for patterning the cobalt silicide layer includes at least one of $BCl_3$, $Cl_2$, a gas mixture of $BCl_3$ and $O_2$, a gas mixture of $Cl_2$ and $O_2$, a gas mixture of $BCl_3$ and Ar, a gas mixture of $Cl_2$ and Ar, a gas mixture of $BCl_3$ and $SF_6$, and a gas mixture of $Cl_2$ and $SF_6$.

13. The method according to claim 1, wherein an etchant gas used for patterning the polycrystalline silicon includes at least one of a gas including a chlorine atom group and a gas including HBr.

14. The method according to claim 13, wherein an etchant gas used for patterning the polycrystalline silicon includes at least one of $Cl_2$, HBr, a gas mixture of $Cl_2$ and $O_2$, a gas mixture of HBr and $O_2$, a gas mixture of $CL_2$ and $N_2$, and a gas mixture of HBr and $N_2$.

15. A method according to claim 1, wherein the patterning of the cobalt silicide layer comprises dry etching the cobalt silicide layer in an etchant gas comprising $BCl_3$.

16. A method according to claim 1, further comprising:
    forming a bit line on the cobalt silicide layer, wherein the second insulating layer insulates the cobalt silicide layer from the bit line.

17. A method for forming a semiconductor device, comprising:
    providing a semiconductor substrate;
    sequentially forming a first insulation layer, a polycrystalline silicon layer and a cobalt silicide layer on the semiconductor substrate;
    forming a second insulation layer consisting of one of an oxide and a nitride on the cobalt silicide layer;
    patterning the second insulation layer;
    patterning the cobalt silicide layer by using the patterned second insulation layer as a mask and etching the cobalt silicide layer with at least one etchant gas including $BCl_3$; and
    patterning the polycrystalline silicon layer to form a gate electrode, wherein the second insulation layer is not removed and serves as a capping insulation layer for insulating the cobalt silicide layer.

18. The method according to claim 17, wherein the etchant gas is one of a first gas mixture including the chlorine atom group and oxygen and a second gas mixture including the chlorine atom group and an inert gas.

19. The method according to claim 18, wherein the etchant gas and the gas mixtures further include a gas having a fluorine atom group.

20. A method according to claim 17, wherein the patterning of the cobalt silicide layer comprises dry etching the cobalt silicide layer in an etchant gas comprising $BCl_3$.

21. A method according to claim 17, further comprising:
    forming a bit line on the cobalt silicide layer, wherein the second insulating layer insulates the cobalt silicide layer from the bit line.

* * * * *